United States Patent [19]

De Weck

[11] Patent Number: 4,667,165

[45] Date of Patent: May 19, 1987

[54] HIGH-SPEED FULL DIFFERENTIAL AMPLIFIER WITH COMMON MODE REJECTION

[75] Inventor: Lionel M. De Weck, Santa Clara, Calif.

[73] Assignee: Advanced Micro Devices, Inc., Sunnyvale, Calif.

[21] Appl. No.: 831,012

[22] Filed: Feb. 19, 1986

[51] Int. Cl.[4] ............................................. H03F 3/45
[52] U.S. Cl. .................................... 330/253; 330/255; 330/257; 330/258; 330/311
[58] Field of Search ............... 330/253, 255, 257, 258, 330/263, 264, 311

[56] References Cited

U.S. PATENT DOCUMENTS 3,921,090 1/1975 Wheatley, Jr. et al. ............ 330/257

FOREIGN PATENT DOCUMENTS 0023246 2/1977 Japan .................................... 330/257

OTHER PUBLICATIONS

Ahuja et al, "A Programmable CMOS Dual Channel Interface Processor for Telecommunications Applications, *IEEE Journal of Solid-State Circuits*, vol. SC-19, No. 6, Dec. 1984, pp. 892-899.

*Primary Examiner*—James B. Mullins
*Attorney, Agent, or Firm*—Patrick T. King; Davis Chin

[57] ABSTRACT

A high speed low power linear two micron CMOS full differential operational amplifier has a pair of output cascode stages each providing a respective differential output with rejected common mode signals. The amplifier comprises an input differential amplifier stage driving a pair feedback current mirror loads each cross connected to the pair of cascode output stages providing the differential outputs. Current domain operation provided by current mirror arrangements enables fast operation of the full differential amplifier. Each output cascode stage comprises four stacked transistors including two signal transistors and two dynamically biased pass transistors. The feedback current mirror loads and the cascode output stages provide the amplifier with single gain stage respecting each differential output thereby reducing the need for large compensation capacitors while improving the dynamic range of the two differential outputs. The gain of amplifier is ninety decibels with a frequency bandwidth of fifty megahertz and with low power dissipation at two milliwatts. The amplifier also comprises two feedback differential stages receiving a single combined common mode signal formed from the two differential outputs. Each feedback differential stages then drives a respective pair feedback current mirror loads which provide negative feedback signals to the output cascode stages whereby common mode signals are rejected at the differential outputs.

14 Claims, 3 Drawing Figures

HIGH-SPEED FULL DIFFERENTIAL AMPLIFIER WITH COMMON MODE REJECTION

CROSS REFERENCE

Cross reference is here made to applicant's copending patent applications entitled "High Speed Operational Amplifier" Ser. No.: 831,020, filed on: 2/19/86, and "High Speed Comparator with Controlled Hysteresis", Ser. No.: 831,039, filed on: 2/19/86.

BACKGROUND

The present invention relates to electronics and electronic circuits. More specifically, the present invention relates to amplifier circuits and operational amplifiers.

More specifically, the present invention relates to a full differential operational amplifier circuit having differential feedback stages rejecting common mode signals at the output of the differential operational amplifier. Heretofore operational amplifiers circuits have been designed in a wide variety of configurations and fabricated by a wide variety of process technologies.

A well known operational amplifier is the full differential amplifier having a positive differential input and a negative differential input and having a positive differential output and a negative differential output. The voltage potential difference between the two inputs is amplified and presented as a differential output signal between the two differential outputs of the full differential amplifier.

One of the most significant uses of the differential amplifier is controlled amplification through negative feedback. Negative feedback occurs when an output signal of the amplifier is fedback to the negative input. Negative feedback of the differential operational amplifier provides for predictable controlled closed loop amplification over the bandwidth of the amplifier.

The designers of operational amplifiers have continually strived for better performing amplifiers. Input offset currents, input offset voltages, bandwidth, gain, input impedance, output impedance, inter alia, are parameters that are considered by those who select differential amplifiers for particular applications. Gain and bandwidth are the two most commonly considered parameters. As the gain of the differential operational amplifiers increases, the circuit using a differential operational amplifier with negative feedback, become more precise and predictable. The higher the bandwidth, the higher the operating frequency. The gain-bandwidth product is a combined parameter of usefulness of an amplifier. These and other parameters are defined by the inherent design of the amplifier.

Typical full differential amplifier designs include a differential input stage, which is a gain stage, connected to a pair of output gain stages each providing a respective differential output. A large compensation capacitor is dispose between the differential input stage and each of the two output gain stages.

The gain of the differential amplifier is the product of the gain of the differential input stage multiplied by the gain of the output gain stage. The gain for conventional two micron linear CMOS amplifiers may be approximately fifty thousand. Each output gain stage is typically followed by a respective follower output stage. The buffering output stages provide the amplifier differential outputs with a low output impedance desired in many circuit applications.

As examples of other full differential amplifiers, the TL592 and TL592A "Differential Video Amplifier" manufactured by TEXAS INSTRUMENTS, and the NE592 and SE592 "Video Amplifier" manufactured by SIGNETICS, are full differential amplifier characterized by amplification provided by two cascaded gain stages between the differential inputs and the differential outputs.

Three different operational amplifiers, two in CMOS technology and the other in bipolar technology, having differential inputs stages, compensation capacitors and outputs gain stages having conventional designs are disclosed in U.S. Pat. No. 4,464,588 (hereinafter 588), U.S. Pat. No. 4,383,223 (hereinafter 223) and U.S. Pat. No. 4,477,780, (hereinafter 780) all of which are here incorporated by reference as there fully setforth. Differing process technologies, for examples CMOS and bipolar, may use substantially similar designs U.S. Pat. No. 223 discloses a CMOS operational amplifier having conventional current mirror loads in the input differential stage, and an output push-pull stage with a compensation capacitor connected therebetween. U.S. Pat. No. 588 discloses a CMOS amplifier having the positive input connected to a ground reference and having its output negatively fedback to the negative input thereby forming a voltage reference circuit.

U.S. Pat. No. 780 discloses a bipolar amplifier with multiple output follower stages each of which is negatively fedback to the negative input with the positive input connected to a ground reference thereby forming a multiple voltage reference circuit. Though the applications of the operational amplifier may be different, all three circuits include a conventional operational amplifier having a differential input stage, a compensation capacitor and an output gain stage.

The compensation capacitor between the two gain stages produces an increasing gain attenuation above a predetermined frequency which is substantially lower than the natural frequency of the operational amplifier, at which natural frequency the amplifier obtains additional 180 phase shift between its inputs and its outputs. A 180 degrees of phase shift of the negative feedback connection when added to the additional 180 of phase shift associated with the natural frequencies, can cause the amplifier to become unstable and oscillate by virtue of positive feedback associated with 360 degrees of phase shift between the inputs and the outputs.

The gain attenuation caused by the compensation capacitor is so severe at the high natural frequency of the amplifier, that the gain of the amplifier is substantially less than one so that only a portion of the output signal is positively fedback thereby preventing unstable oscillations.

In classical two stage amplifiers, the compensation capacitor is positioned between the two gain stages perfecting a Miller effect. The Miller effect, enabled by feedback through the capacitor from the output of the output gain stage to the output of the input stage, provides equivalent capacitive compensation corresponding to the gain of the first stage multiplied by the capacitance of the compensation capacitor. This multiplication factor reduces the required capacitance thereby reducing the size of a corresponding compensation capacitor. Miller effect compensation techniques are generally well known in the art.

U.S. Pat. No. 223 discloses a compensation capacitor twenty. U.S. Pat. No. 877 discloses a compensation capacitor twenty six. U.S. Pat. No. 780 discloses compensation capacitor fourteen. Even though the Miller effect reduces the size of the compensation capacitor, sufficient compensation still requires relatively large capacitance correspondingly requiring large semiconductor area and therefore decreases the yields and increases the cost of semiconductor devices. Also, the capacitors, as they are intended to do, decrease the bandwidth of the amplifier, for example, to five megahertz.

Moreover, large capacitors tend to pass large currents which in turn require more power for a power source thereby dissipating more power in the amplifier device. Conventional CMOS amplifiers, for example, the NE592 linear CMOS amplifier dissipates approximately 20 milliwatts.

The input differential stage generally includes two coupled transistors connected to a current source drawing a constant current through the coupled transistors. The sum of the current through each equals the constant current. The current through the coupled transistors will generally follow a hyperbolic tangent curve permitting rapid current change with little voltage change at the inputs of the transistors providing a high voltage to current conversion in the input differential stage.

A modern means of obtaining a constant current is by use of well known current mirrors. Typically, in a current mirror, a constant current is established in a current path transistor through a stacked resistor both connected in series between power supply references. The current which flows therethrough is generally equal to the difference between the power supply references divided by the sum of resistances of the resistor and the current path transistor. A mirror transistor is then connected to the current path transistor, such that both transistors conduct the same amount of current. A conducting terminal of the mirror transistor then acts as a constant current source varying its transconductance to maintain the constant current therethrough.

An improved current mirror is the feedback current mirror commonly known as the Wilson current mirror. A commercially available part manufactured by TEXAS INSTRUMENTS called the TL010I or TL010C "Adjustable-Ratio Current Mirrors" comprises a plurality of Wilson current mirror circuits.

U.S. Pat. No. 588 discloses a feedback current mirror comprising transistors twenty nine, thirty and thirty one. Transistor thirty one has a gate terminal which is fedback and connected to the input transistor twenty nine. The feedback connection and the use of transistor thirty one improves the performance of the current mirror by reducing second order effects of output voltages of the current mirror which effect disadvantageously change the current in a constant current mirror.

U.S. Pat. No. 588 also discloses conventional current mirrors, for example, the circuit comprising transistors thirty three and seventeen, and, for example, the circuit comprising transistors eighteen and nineteen.

U.S. Pat. No. 223 has a conventional current source comprising transistor six providing constant current to coupled transistors eight and twelve. Also, transistors ten and fourteen therein form a conventional current mirror load of the coupled transistors providing a voltage output characterized by large voltage fluxion.

U.S. Pat. No. 780 discloses two emitter coupled PNP transistors eleven and twelve, connected to a fifteen microampere constant current source. U.S. Pat. No. 588 discloses source coupled P channel MOS transistors connected to a constant current source providing a constant current I. U.S. Pat. No. 588 has a current mirror comprising current path transistors twenty eight and twenty nine, establishing a constant current through transistors thirty three, thirty two and thirty, which constant current is then established in a mirror transistor seventeen drawing a constant current through coupled transistors fourteen and fifteen. These are common current mirror arrangements.

All three circuits of U.S. Pat. Nos. 223, 780 and 588 have mirror current loads in the input differential stage for providing voltage gain in the input differential stage. For example, in U.S. Pat. No. 588, transistor nineteen reflects the current in transistor eighteen, and transistor nineteen provides for high voltage gain at its drain terminal by virtue of a high impedance into that drain terminal.

Some input differential stages provide for voltage to current amplification using current mirror active loads. For example, a current mirror load having a first and a second MOS transistor having their source connected to a positive power source, having their gate terminals connected together and connected to the output of an input transistor, while the drain of the first transistor is also connected to output terminal of the input transistor.

The drain terminal of the second transistor acts as a current source at its drain terminal reflecting the current in the first transistor which in turn reflects the current through the input transistor. Hence, a voltage change at the gates of the input transistors produces a current reflection at the drain output of the second transistor.

One problem associated with this voltage to current reflection configuration of the input differential stage using CMOS current mirror active loads, is the second order effect of small signal voltage levels at the drain terminal of the second transistor, which drain terminal acts as a current source driving other cascaded circuits. The second order effect of a small signal voltage superimposed at the output of the second transistor causes a corresponding fluxion of the output current by virtue of the output transistors having a drain current versus drain to source voltage curve which has a slope corresponding to an output impedance. More simply, a change in output voltage of this current source causes a change in the current value. This change in current does not occur in ideal current sources.

This second order effect slows down the operation of the input differential stage because the current mirror load requires time to react to the superimposed voltage change causing an unwanted temporary change in the output current.

Another problem associated with two stage voltage gain amplifiers are parasitic effects in which large varying voltage signals produce current flow in parasitic capacitance thereby reducing the bandwidth of the amplifier. Hence, amplifiers which operate on internal voltage signals with large amplitude variation tend to have lower slew rates and bandwidths.

Some input differential amplifiers stages have been connected to CMOS cascode output stages which provide high gain and which typically comprises four transistors stacked vertically between a positive voltage reference and a negative voltage reference. The top and bottom transistors act as signal transistors while the middle two act as pass transistors. The two pass transistors have their gate terminal connected to a bias reference voltage and pass a signal from a respective signal transistor to the output at the connection between the two pass transistors. The two signal transistors have their gate terminals connected to two differential voltage signals.

One problem associated with the use of pass transistors in the cascode stage is the presence of two transistors between the output and a power reference thereby limiting the dynamic range of the amplifier output voltage signal. Consequently, for CMOS technology, the amplifiers typically require an additional high voltage power supply in a five volt logic system.

Another problem associated with the use of pass transistors in the cascode stage is that the bias is fixed to a voltage reference thereby preventing variable bias. The slew rates and settling time of high speed signals are limited by slow fixed bias pass transistors. Conventional two stage amplifiers with large voltage fluxion using fixed bias pass transistors in the cascode stage typically have slow slew rates of ten volts per microsecond and slow one percent settling times of 300 nanoseconds, for example, in response to a two volt step.

One of foremost problems associated with full differential operational amplifiers having differential outputs, is superimposed common mode signals upon the differential output signals. Heretofore solutions to the superposition of the common mode signals has been to design the full differential amplifiers with precision components providing open loop rejection. However, these solutions do not provide for operative closed loop rejection of the common mode single, which rejection is far superior to the open loop common mode rejection by virtue of the dynamic negative feedback providing controlled operations continued through the operating frequency range of the amplifiers.

Though heretofore designs of conventional operational amplifiers were improvements over previous designs, those skilled in the art strive ever more to yet further improve upon those designs. The foregoing amplifiers having the corresponding disadvantages or design limitations are further improved upon using teachings of the present invention.

SUMMARY

An object of the present invention is to provide a full differential amplifier having an improve gain bandwidth product.

Another object of the present invention is to provide a full differential amplifier having an improved dynamic output range respecting given power supply references.

Yet another object of the present invention is to provide a full differential amplifier having a single voltage gain stage reducing the need for large compensation capacitors.

A further object of the invention is to provide an input differential stage which reduces second order effects of current mirror source loads.

Yet a further object of the present invention is to provide a voltage to current input differential amplifier stage driving a dynamically biased cascode output stage for improving the speed and the dynamic range of the amplifier while reducing power dissipation.

Still a further object of the present invention is to provide common mode rejection through a negative feedback circuit.

Yet another object of the present invention is to provide common mode rejection respecting each differential output by respective negative feedback circuits.

Still another object of the present invention is to provide common mode rejection respecting each differential output by virtue of respective negative feedback circuits comprising differential stages using feedback current mirror loads.

The present invention including various improved features, is embodied in a high speed full differential amplifier fabricated by a two micron CMOS process. The amplifier, with improved performance characteristics may be used in a wide variety of circuit applications.

The full differential amplifier comprises an input differential stage having feedback current mirror loads, which input differential stage has two sets of outputs. Each set of outputs comprises a voltage signal output and a current signal output. The four outputs of the input stage are connected through a current mirror stage to two cascode stages each comprising four stacked transistors. Each cascode output stage has two signal transistors respectively receiving the voltage signals of the input stage and has two pass transistors respectively receiving the current signals of the input stage. The input differential stage combine with each separate cascode output stage forming a single gain stage with each cascode output stage providing a differential output signal.

The use of the fedback current mirrors as active loads in the input differential stage provide the current source outputs which are relatively insensitive to second order effect of superimposed voltage levels at their output thereby propagating fast current signals in the current domain through the current mirror stage to the pass transistors of the cascode output stages. Consequently, the pass transistors are dynamically biased with fast current signals which tends to improve the speed and gain of the amplifier. The dynamic biasing of the pass transistors also tends to reduce the required DC voltage drops between the power references and the output of the amplifier thereby improving the dynamic range of the output given particular power references of a power source.

The single gain stage structured by combining the input differential stage having current domain output signals and a dynamically biased cascode output stage, extends the natural frequency of the amplifier so that relatively small compensation capacitors can be optionally used.

The unity gain bandwidth of the amplifier is increased to fifty megahertz while retaining a high amplifier gain of fifty thousand. The amplifier uses current mirror arrangements conducting when necessary large current signal fluxion rather than large voltage signal fluxion. The single gain stage structure provides large current variations rather than large voltage signal variations thereby reducing the Miller and parasitic effects and thereby inherently improving the speed of the operational amplifier.

The full differential amplifier circuit operates primarily in the current domain. Voltage signals primarily appear at high impedance terminals of all the transistors so that current and the corresponding power dissipation is used only upon demand thereby making the amplifier more power efficient.

The full differential amplifier further comprises two separate feedback differential stages providing negative feedback eliminating common mode signals superimposed upon the differential output signals. A common mode signal is provided by a resistive network between the two differential outputs. This common mode signal is received by the feedback differential stages providing common mode rejection signals to the cascode output stages which then subtract the superimposed common mode signals from the differential output signals. The feedback differential stages also include other feedback current mirror loads for relatively fast operation in the current domain.

The full differential amplifier circuit provides many improved performance characteristic and resulting advantages over of heretofore amplifier designs. These and other advantages will become more apparent from the following description of the preferred embodiment and from the accompanying drawings.

For further understanding of the herein disclosed invention, reference is made to applicant's copending patent applications entitled "High Speed Operational Amplifier" Ser. No.: 831,020, filed on: 2/19/86, and "High Speed Comparator with Controlled Hysteresis", Ser. No.: 831,039, filed on: 2/19/86, both of which are here incorporated by reference as there fully set forth.

DRAWING DESCRIPTIONS

PREFERRED EMBODIMENT

Figure 1:
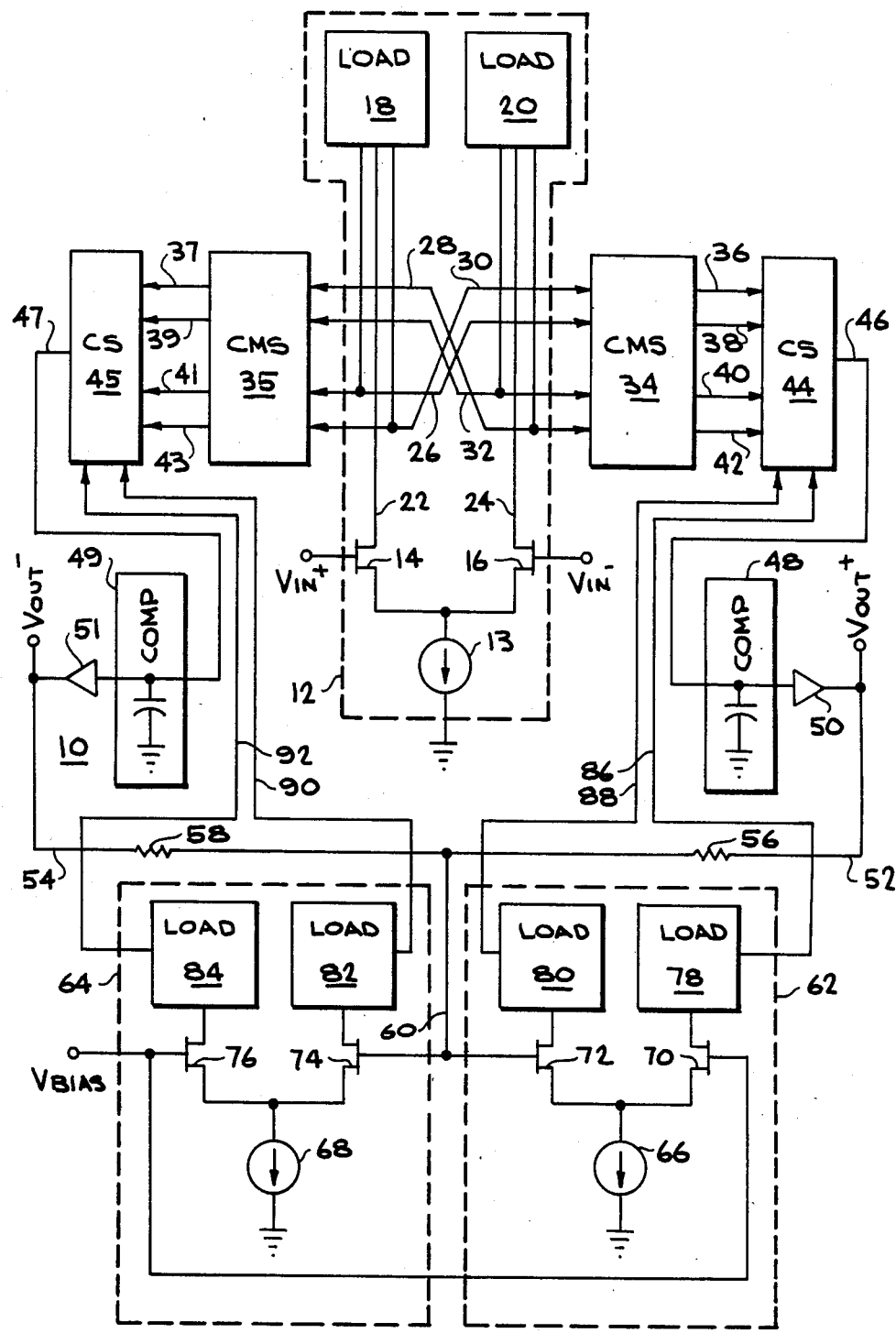
FIG. 1 is a block diagram of a full differential operational amplifier.

Referring to FIG. 1, a full differential amplifier 10 amplifies an input differential signal between a pair of inputs terminal Vin+ and Vin− and provides an amplified differential output signal between a pair of output terminals Vout− and Vout+. The differential output signal is equal to a gain of the amplifier multiplied by the differential input signal.

The differential amplifier 10 has an input differential stage 12 comprising a constant current source 13, two coupled transistors 14 and 16 and two feedback current mirror loads 18 and 20. The input current into the input terminals Vin+ and Vin− is negligible. The constant current source 13 draws a constant current through the coupled transistors 14 and 16 which in turn draw the same constant current through the loads 18 and 20. The current through transistor 14 equals the current through the 18 load and the current through transistor 16 equals the current through the load 18.

The sum of the currents flowing through transistors 14 and 16 equals the sum of the current flowing through loads 18 and 20 on lines 22 and 24, respectively, which sum equals to the constant current of the constant current source 13. As the voltage difference varies between the Vin+ terminal and the Vin− vary, so does the current flowing through respective transistors 14 and 16, respective lines 22 and 24 and respective loads 18 and 20.

The loads 18 and 20 have a current output lines 26 and 28, respectively, and have voltage output lines 30 and 32, respectively. Current and voltage signals on output lines 26, 28, 30 and 32 are cross connected to two current mirror stage 34 and 35. Each current mirror stages 34 and 35 provides four respective voltage signals on lines 36, 38, 40 and 42, and 37, 39, 41 and 43 each of which is presented to a respective cascode transistors in two cascode stages 44 and 45.

The cascode stage 44 combines the four voltage signals on line 36, 38, 40 and 42 and provides a amplified positive differential output signal on line 46, while the cascode stage 45 combines the four voltage signals on lines 37, 39, 41 and 43 and provides an amplified negative differential output signal on line 47.

The cascode stage 44 is optionally connected to compensation capacitors in a compensation stage 48 through line 46. The line 46 is also optionally connected to a voltage follower stage 50 buffering the positive differential output signal on line 46 and presenting a buffered amplified positive differential output signal onto the positive output terminal Vout+. Likewise, the cascode stage 45 is optionally connected to compensation capacitors in a compensation stage 49 through line 47. The line 47 is also optionally connected to another voltage follower stage 51 buffering the negative differential output signal on line 47 and presenting a buffered amplified negative differential output signal onto the negative output terminal Vout−.

In amplifying operation, the negative differential output signal varies equipotentially, that is, equally but oppositely, to the positive differential output signal. The characteristic electronic processing internal to the amplifier 10 providing one output signal corresponds equally but oppositely to the electronic processing providing the other output signal.

The coupled input transistors 14 and 16 cause current changes through loads 18 and 20 as the differential input voltage varies between the Vin+ and Vin− terminals. Lines 26, 28, 30 and 32 are cross connected to the current mirror stages 34 and 35 so as to equipotentially provide equal but opposite differential output signals.

The loads 18 and 20 produce corresponding changing current and voltage signals which are equally but oppositely reflected by the current mirror stages 34 and 35 presenting equal but opposite outputs signals to the cascode stage 44 and 45, respectively.

The input differential stage 12 does not provide gain as do most conventional operational amplifiers because the current through the coupled input transistors 16 and 18 equal the current through the loads 18 and 20 thereby providing current signals. The loads 18 and 20 combine with the cascode stages 44 and 45 providing a single gain stage for each respective differential output signal. This combination provides a single gain amplification feature of the full differential amplifier 10.

In the contemplated best mode of carrying out the present invention, optional compensation stages 48 and 49 and optional follower stages 50 and 51 provide a respective compensated and buffered amplified differential output signal presented onto the respective output terminals Vout+ and Vout− respectively connected to lines 52 and 54. The compensation and buffering provisions are not absolutely necessary features of the present invention.

Each differential voltage signal equipotentially varies between a positive power supply reference and a ground reference as the differential input voltage varies. The differential output signals equipotentially vary about a bias voltage on a bias terminal Vbias. The bias voltage, which is typically set at the midpoint between the power and ground references, is a reference above and below which each differential output equipotentially varies.

Each of the differential output signals is a composite signal comprising a differential amplified output signal responsive to the differential input signals and possibly a superimpose common mode signal. A common mode signal is an additional superimposed voltage signal which may typically appear at times to be a superimposed DC voltage signal.

The common mode signal is equal to the difference between the average voltage potential of the differential output signals minus the bias voltage on the bias voltage terminal Vbias. The herein disclosed circuit operates to counterbalance and eliminate these unwanted superimposed common mode signals from the differential output signals.

An average output signal, that is, one half of the sum of the differential output signals is provided by a resistive network comprising resistors 56 and 58 connected is series between the differential output signals on lines 52 and 54. The average output signal on a line 60 is routed to a pair feedback differential stages 62 and 64 which firstly functions to determine the difference between the average output signal on line 60 and the bias voltage on the bias voltage terminal Vbias, that is, to determine the common mode signal, and secondly functions to reject this common mode signal from the differential output signals by negatively feeding back common mode rejection signals to the cascode stages 44 and 45.

The feedback differential stages 62 and 64 comprise respective current sources 66 and 68, respective pairs of coupled transistors 70 and 72, and 74 and 76, and respective pairs of feedback current mirror loads 78 and 80, and 82 and 84. The coupled transistors 70 and 72 respectively drive loads 78 and 80, as coupled transistor 74 and 76 respectively drive loads 82 and 84. Loads 78, 80, 82 and 84 provide common mode rejection signals in the current domain on respective lines 86, 88, 90 and 92 which are connected to the cascode stages 44 and 45.

The negative feedback operation is perfected by firstly averaging the differential outputs, secondly determining the difference between the bias voltage and the average output signal, thirdly deriving common mode rejection signals and lastly presenting the common rejection signals to the cascode stages 44 and 45 which combine the common rejections signals with differential outputs signals so as to counterbalance and eliminate the superimposed common mode signals from the differential output signals.

Figure 2:
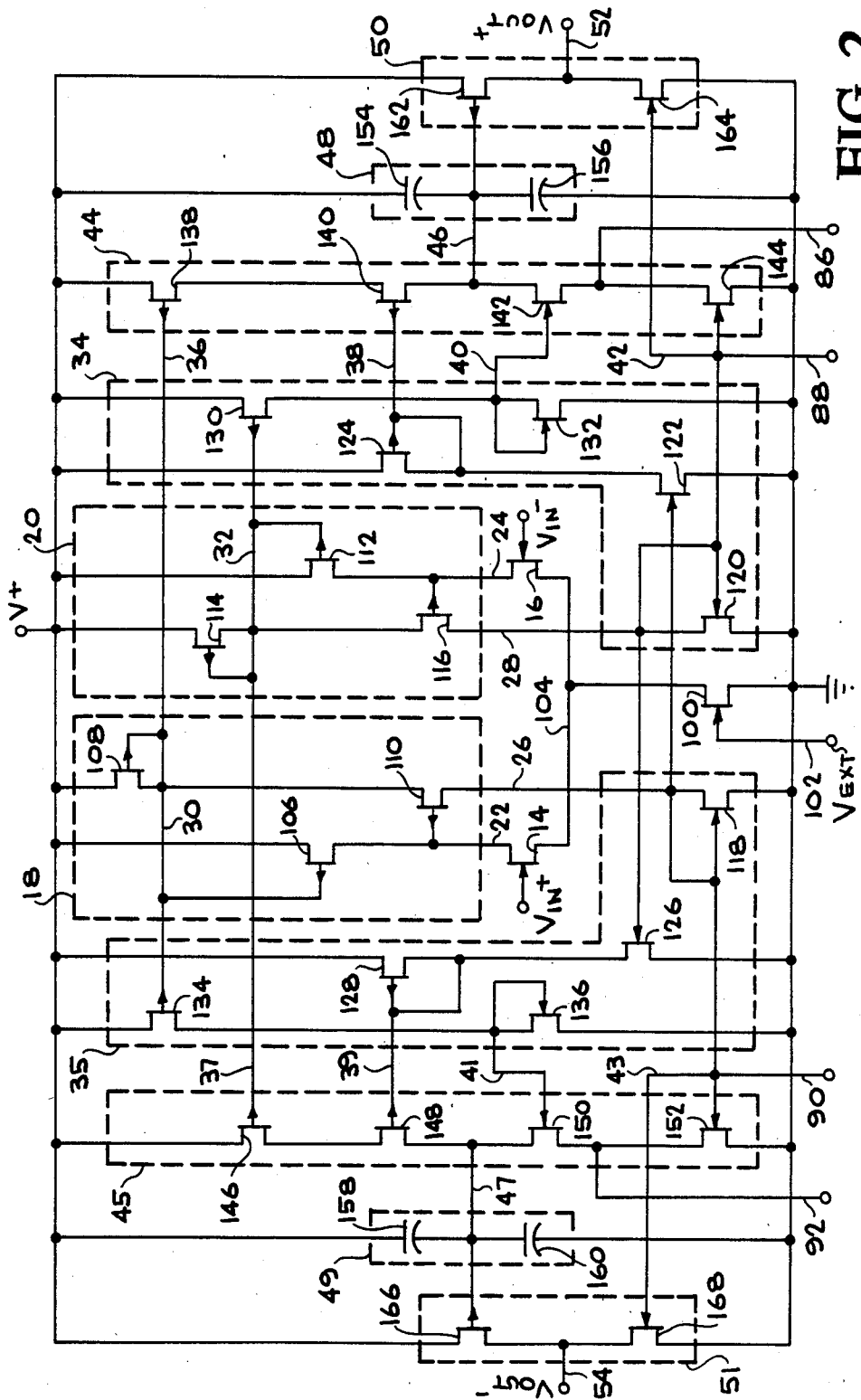
FIG. 2 is a schematic diagram of a portion of the full differential amplifier including an input differential stage and cascode output stages.

Referring to FIGS. 1 and 2, in this preferred embodiment, the full differential 10 is fabricating by a two micron CMOS process providing only two different types of transistors, P channel MOS enhancement field effect transistors and N channel MOS enhancement field effect transistors. Enhancement transistors conduct with an applied gate voltage causing an inversion conducting layer between the drain and source terminals of the transistors.

However, those skilled in the art may readily appreciate the employment of different transistors, for example, depletion transistors which conduct current through a diffused conducting layer between the source and drain terminals without an applied gate voltage. Moreover, those skilled in the art may employ different process technologies to construct similar full differential amplifiers which may represent different embodiments of the instant invention.

The P and N channel transistors are distinguish by reference arrows placed at the gate terminals thereof. A N channel MOS transistor has an arrow directed toward the gate terminal while the P channel MOS transistor has an arrow directed away from the gate terminal.

The source terminal of the transistor is that terminal which is closest connected to the positive power supply reference V+ for the P channel transistor or closest connected to the ground reference for the N channel transistors.

The preferred embodied full differential amplifier 10 was diffused in a monolithic silicon die providing respective bulk terminals for each of the transistors. Generally, the bulk terminals are normally connected to the source terminal as is standard practice in CMOS designs.

The discussions herein relating to the full differential amplifier circuit fabricated in one particular process technology may well be equally applicable to a wide variety of process technologies, and more particularly to PMOS, NMOS, CMOS and bipolar processes technologies as well as discrete component circuits, and equally applicable to differing devices such as junction field effect transistors, MOS enhancement field effect transistors, MOS depletion field effect transistors, or PNP and NPN bipolar transistors.

The current through current source 13 is provided by a mirror transistor 100 having its drain terminal connected to the source terminals of the coupled input transistors 14 and 16. The constant current flowing through the transistor 100 is established by applying a voltage on a terminal Vext which is connected to an external voltage reference circuit (not shown) providing the voltage signal on the terminal Vext establishing current flow through the amplifier 10 and therefore enabling the operation of the amplifier 10.

The drain terminal of transistor 100 is connected to line 104 which couples together the source terminals of input transistors 14 and 16. The feedback current loads 18 and 20 are respectively connected to the drain terminals of the input transistors 14 and 16, through lines 22 and 24, respectively. Each feedback current load 18 and 20 comprise a set of three interconnecting transistors including current path transistor 106, current mirror transistor 108, and feedback transistor 110, and current path transistor 112, current mirror transistor 114 and feedback transistor 116, respectively. In similar operation, both loads 18 and 20 conduct current signal equally but oppositely therethrough. As the current through one load increases, the current through the other decreases as an intrinsic essential operation of the input differential stage 12.

Depending upon the voltage different between the differential input voltage terminal Vin+ and Vin−, a portion of the constant current through transistor 100 will flow through transistor 14 while the remaining portion flows through transistor 16. The current through the transistor 14 and transistor 16 will flow through loads 18 and 20, respectively.

The detail operation of the feedback current load 18 is best appreciated by realizing that an applied gate to source voltage establishes a given current through a transistor. Depending upon the voltage difference between the input terminals Vin+ and Vin−, a corresponding current and necessary voltages develop on line 22 and 24. The voltage and current through lines 22 and 24 establish the current through the loads 18 and 20, respectively, through feedback transistors 110 and 116, respectively. The feedback transistors 110 and 116 establish a voltage and current on line 30 and 32, respectively, for establishing the current through load 18 and 20, respectively.

For example, the voltage established on line 30 by transistor 110 is applied to the gate terminals of the mirror transistor 108 and current path transistor 106. Both transistor 106 and 108 then conduct this mirror current which also conducts through feedback transistor 110 which operates as a current source providing a current signal upon line 26. Feedback within the current load 18 is providing by connecting the gate terminal of feedback transistor 110 to the drain terminal of the current path transistor 106. This feedback connection provides for a high impedance into the drain terminal of feedback transistor 110 thereby providing the mirror current which is relatively insensitive to superimposed small voltage signals that may appear on line 26. The load 20 similarly operates as does load 18.

Current signals on lines 26 and 28 and voltage signals on lines 30 and 32 are cross connected to the current mirror stage 34 and 35 for level shifting, current to voltage conversion and communication. The current mirror stages 34 and 35 respectively provide the cascode stages 44 and 45 with four synchronously changing voltage signals each on lines 36, 38, 40, and 42, and 37, 29, 41 and 43, inversely changing respectively.

The current mirror stage 34 function to provide level shifts, conversion and communication of voltage and current signals through current mirror arrangements among the transistor of the loads 18 and 30, current mirror stages 34 and 35 and the cascode stages 44 and 45.

A transistor 118 receives the current signal on line 26 and establishes a voltage signal on line 26 which is connected to line 43. Similarly, Transistor 120 receives the current signal on line 28 and established a voltage signal on line 28 which is connected to line 42. The voltage signal on line 26 is level shifted through transistors 122 and 124 thereby providing a voltage signal on line 38. The voltage signal on line 28 is level shifted through transistors 126 and 128 thereby providing a voltage signal on line 39. The voltage signal on line 32 is level shifted through transistors 130 and 132 thereby providing a voltage signal on line 40. The voltage signal on line 30 is level shifted through transistors 134 and 136 thereby providing a voltage signal on line 41. The voltage signal on line 30 is communicated onto line 36. The voltage signal on line 32 is communicated onto line 37.

These current mirror arrangements provide for large current fluxion when needed and small voltage fluxion avoiding Miller and parasitic effects for improved operating speed of the amplifier 10.

In dynamic operation with the voltage on the Vin+ terminal increasing respecting the voltage on the Vin− terminal, the current through load 18 increases, as the current through load 20 decreases, as current through transistor 118 increases, as the current transistor 120 decreases, as the voltage on line 30 decreases, as the voltage on line 32 increases, as the voltages on lines 36, 38, 40 and 42 decrease, as the voltages on lines 37, 39, 41 and 43 increase, as voltage signal on terminal Vout+ increases and voltage signal on terminal Vout− decreases. With the voltage on the Vin+ terminal decreasing respecting the voltage on the Vin− terminal, the dynamic operation is equal but opposite providing inversely synchronously varying equipotential differential output signals.

Each cascode stage 44 and 45 has four series connected vertically stacked transistors. The cascode stage 44 has a positive signal transistor 138 having its gate terminal connected to line 36, a positive pass transistor 140 having its gate terminal connected to line 38, a negative pass transistor 142 having its gate terminal connected to line 40, and the negative signal transistor 144 having its gate terminal connected to line 42, all of which transistors are connected together in order in series between the positive power reference and the ground reference.

The cascode stage 45 has a positive signal transistor 146 having its gate terminal connected to line 37, a positive pass transistor 148 having its gate terminal connected to line 39, a negative pass transistor 150 having its gate terminal connected to line 41, and a negative signal transistor 152 having its gate terminal connected to line 43, all of which transistors are connected together in order in series between the positive power reference and the ground reference.

In dynamic operation, all the cascode transistors 138 through 152 have synchronously varying voltage signals applied to their respective gate terminals. The distinction between nomenclatures of signal transistors and pass transistor is of little significance in light of the dynamic biasing of the pass transistors 140, 142, 148 and 150 because the biasing voltage applied to the pass transistors functions in part as a voltage signal which is amplified and presented at the differential outputs of the amplifier 10.

Each of the positive and negative pair of transistors 138 and 140, 142 and 144, 146 and 148, and 150 and 152, synchronously conduct current. Inverse synchronous current conduction occurs as transistors 142, 144, 146 and 148 increasingly conduct current as transistors 138, 140, 150 and 152 decreasingly conduct current and visa verse.

Generally, and excluding the common mode rejection as later discussed, in dynamic operation with the voltage on the Vin+ terminal increasing respecting the voltage on the Vin− terminal, as the voltages on lines 36, 38, 40 and 42 decrease, as the voltages on lines 37, 39, 41 and 43 increase, as the current through transistors 138, 140, 150 and 152 increases, as the current through transistors 142, 144, 146 and 148 decreases, the the voltage output signal on line 46 increases toward the power reference as the voltage output signal on line 47 decreases towards the ground reference. With the voltage on the Vin+ terminal decreasing respecting the voltage on the Vin− terminal, the dynamic operation is equal but opposite to the above example.

Hence, in dynamic operation with the voltage on the Vin+ terminal increasing respecting the voltage on the Vin− terminal, the voltage on the Vout+ terminal increases as the voltage on the Vout− terminal decreases. Equally but oppositely, as the voltage on the Vin+ terminal decreasing respecting the voltage on the Vin− terminal, the voltage on the Vout+ terminal decreases as the voltage on the Vout− terminal increases.

The dynamic biasing of the pass transistors provides for further increase of the applied gate to source voltage over the applied gate to source voltage of a statically biased pass transistor. This further increase in the applied gate to source voltage enables the pass transistors to conduct at a lower source to drain voltage thereby reducing the necessary voltage drop between the power references and an output signal, thereby increasing the dynamic range of the output signal respecting the power references which are V+ and ground in this preferred embodiment.

The minimum voltage between a power reference and an output signal is improved to near the threshold voltage of a signal transistor 138, 144, 152 or 146. The improved dynamic range enables higher amplification well suited, in many applications, to a single five volt power supply system.

The speed of the operation amplifier is improved by the current domain operation of the amplifier. The signals provided by the loads 18 and 20 are shifted, converting and communicated in current mirror arrangements between the loads 18 and 19 and the cascode stages 44 and 45, with large current fluxion when needed and small voltage fluxion. Furthermore, the amplifier only has one voltage gain stage between the input transistors 14 and 16 and the output terminals Vout+ and Vout−. Thus, there are no large Miller effect compensation capacitor associated with the prior art dual gain stage construction of the full differential operational amplifier 10.

The herein disclosed embodiment approximately has a slew rate of eighty volts per microsecond and a one percent settling time of 50 nanoseconds responding to a two volt step. The unity gain bandwidth of the amplifier 10 is extended to fifty megahertz with a relatively high gain of fifty thousand for a single gain stage amplifier.

Each cascode stage 44 and 45 presents an output signal on the line 46 and 47, respectively, which are optionally connected to two small 0.5 picofarad compensation capacitors 154 and 156, and 158 and 160, respectively. Each pair of compensation capacitors 154 and 156, and 158 and 160 are respectively connected in series between the power reference V+ and ground.

The capacitors 154, 156, 158 and 160 are small is size and well suited for two micron CMOS processes while conducting little current thereby reducing power dissipation in the cascode stages 44 and 45. The capacitors 154, 156, 158 and 160 combine with the current domain operation of the amplifier 10 providing a low power CMOS design, dissipating, on the average, one milliwatt.

The output line 46 and 47 are optionally respectively connected to source followers 50 and 49, each comprising output transistors 162 and 164, and 166 and 168, respectively, connected in series between the power references. The source followers 50 and 54 presence a low output impedance at the output terminals Vout+ and Vout−, respectively. The transistors 164 and 168 are also dynamically bias by the voltage signal on lines 42 and 43, respectively, so as to improve the slew rate of the amplifier and more particularly the output follower stage 50.

Figure 3:
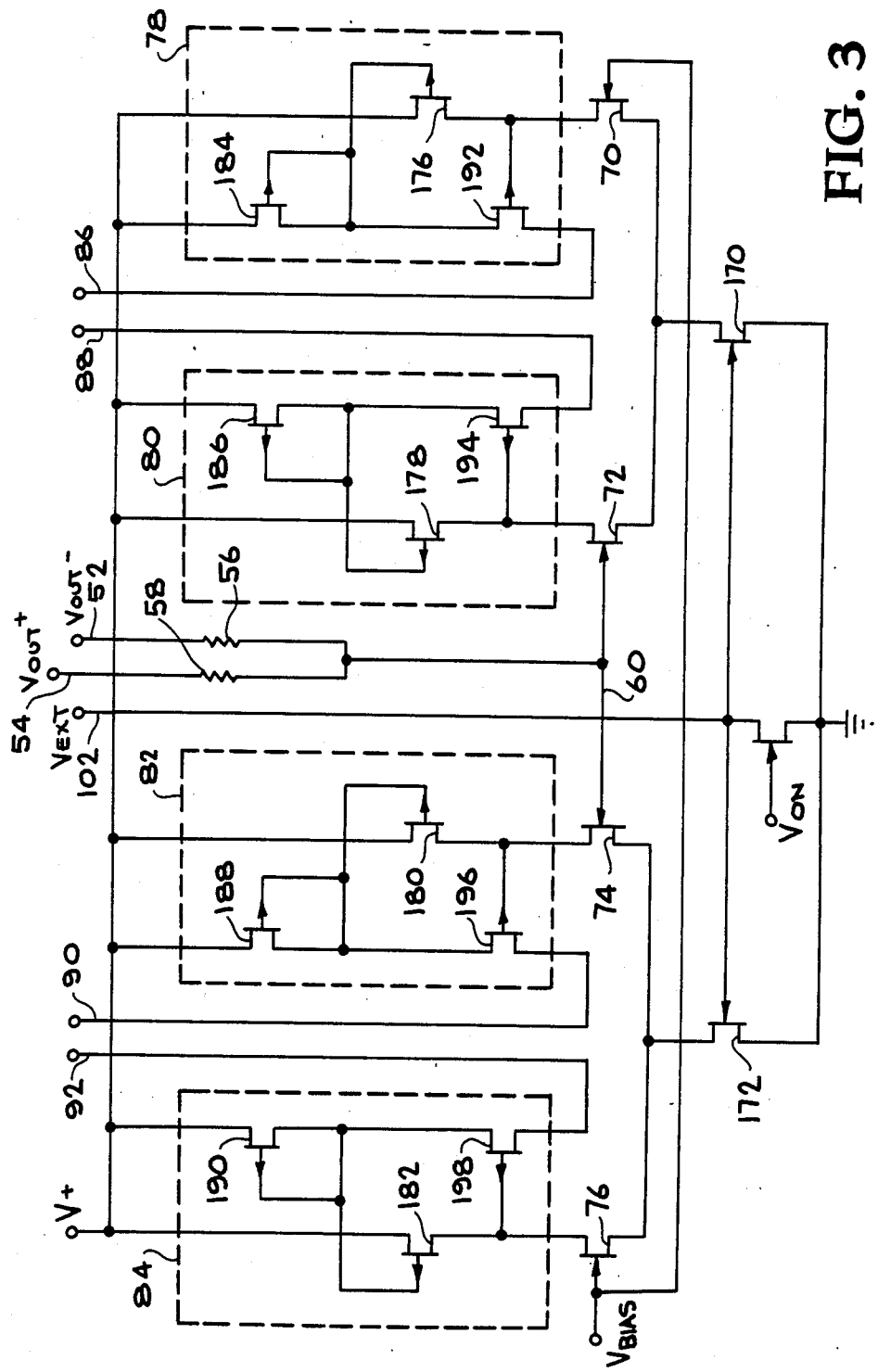
FIG. 3 is a schematic diagram of another portion of the full differential amplifier including two separate feedback differential stages connected to a resistive network providing a common mode signal.

Referring to FIG. 3, each feedback differential stage 62 and 64 includes respective current sources 66 and 68. The current sources 66 and 68 have current therethrough provided by a respective transistor 170 and 172, both of which function as does transistor 100. Both transistors 170 and 172 have their gate terminals connected to line 102 which is also connected to the gate terminal of transistor 100, and further connected to terminal Vext which is connected the external voltage reference circuit (not shown) for establishing a particular constant current through each of the transistors 100, 170 and 172.

A shunt transistor 174 has its drain terminal connected to line 102 and is used to turn off or on transistors 100, 170 and 172. An enabling and disabling signal is presented on a terminal Von, to enable or disable the current flowing through the operational amplifier 10. Hence, the external voltage reference circuit and transistor 174 combine to control the current flowing through the pairs of coupled input transistors 14 and 16, 70 and 72, and 74 and 76, all of which in turn, control the current flowing through remaining portions of the operational amplifier 10.

The constant current which effect the speed of the operational amplifier, can be varied or disabled providing system designs employing the full differential amplifier 10 with means to automatically control or disable the operational amplifier. Hence, the operating current of operational amplifier is externally programmed with a voltage reference to provide a choice in the tradeoff between power dissipation and speed.

Each of the loads 78, 80, 82 and 84 comprises a current path transistor 176, 178, 180 and 182, respectively, a current mirror transistor 184, 186, 188 and 190, and a feedback transistor 192, 194, 196 and 198. Loads 78 and 82 function as does load 20, and loads 80 and 84 function as does load 18, to the extent that the pairs of loads 78 and 80, and 82 and 84, conduct current equally but oppositely responsive to differential input voltages presented at the gate terminals of the coupled transistors 70 and 72, and 74 and 76, respectively.

Each load 78, 80, 82 and 84 presents, in the current domain, common mode rejection signals on lines 86, 88, 90 and 92, respectively. The commode mode rejection signals are responsive to the difference between the average voltage signal on line 60 and the bias voltage on the bias terminal Vbias. The common mode rejection signals serve to equipotentially center the differential outputs signals on lines 52 and 54 equally but oppositely about the bias voltage Vbias, and thereby reject superimposed common mode signals on the differential output terminals Vout+ and Vout−.

The common mode rejection signals, in the current domain, on lines 86 and 88, and 90 and 92 are presented to cascode signal transistors 144 and 152 respectively. The current through lines 86 and 88, and 90 and 92 flows towards the transistor 144 and 152, respectively.

In dynamic operation, with the average common mode signal lesser than the bias reference, as the current through line 88 decreases, as the current through line 86 increases, as the current through line 90 decreases, as the current through line 92 increases, the current through pass transistors 142 and 150 decrease, as the current through signal transistors 144 and 152 decrease, causing the output voltage on line 52 to increase as the output voltage on line 54 decreases, thereby increasing the average common mode signal.

Likewise, in opposite dynamic operation, with the average common mode signal greater than the bias reference, an equal but opposite operation occurs. Hence, common mode rejection signals on line 86, 88, 90 and 92 cause either, the output voltages on the terminals Vout+ and Vout− increase or decrease in synchronism. That is, the common mode rejection signals cause the differential output signals to synchronously increase or decrease equipotentially towards the Vbias reference responsive to increasing or decreasing current through lines 86, 88, 90 and 92. Those skilled in the art may now appreciate the effect that the current on lines 86, 88, 90 and 92 has upon transistors 142, 144, 150 and 152 and may select different transistors in the cascode stages 44 and 45 to be responsive to common mode rejection signals.

The negative feedback operation of the feedback differential stages 62 and 64 counterbalance and eliminate the difference between the average common mode signal on line 60 and the bias reference. When the average common mode signal is greater than the bias voltage, the common mode rejection signals cause both of the output voltages on lines 52 and 54 to decrease thereby reducing the average common mode signals toward the bias reference. When the average common mode signal on line 60 is lesser than the bias reference, the common mode rejection signals cause both of the output voltages on line 52 and 54 to increase thereby increasing the average common mode signal towards the bias voltage. Hence, the negative feedback operation of the feedback differential stages 62 and 64 tend to cause the average common mode signal to equal the bias voltage and thereby tend to equipotentially center the output signals on lines 52 and 54 equally but oppositely about the bias reference which is in this preferred embodiment 2.5 volts.

The negative feedback common mode rejection operation is rapid because of the current domain operation of the current mirror arrangements between the loads 78, 80, 82 and 84, and the cascode stages 44 and 45, and is accurate through closed loop negative feedback of current signals provided by the feedback current mirror loads 78, 80, 82 and 84 used in the feedback differential stages 62 and 64.

The herein disclose invention encompasses a high performance full differential amplifier enabling high speed low power amplification with common mode rejection. Even though those skilled in the art may conceive and invent circuit and full differential amplifier designs and modifications, those designs and modifications may nevertheless represent applications and principles within the spirit and scope of the present invention as defined by the following claims.

What is claimed is:

1. A full differential amplifier circuit receiving a pair of differential inputs and providing a pair of differential outputs, comprising:
   current source means providing a source of current,
   a pair of coupled transistor means for respectively receiving said pair of differential inputs, said pair of coupled transistor means connected to said current source means for conducting said current,
   a pair of feedback current mirror means each for conducting a respective portion of said current, said feedback current mirror means providing signals responsive to said pair of differential inputs,
   a pair of cascode stage means for receiving said signals and for providing said pair of differential outputs which change inversely to each other in response to the differential inputs, each of said pair of cascode stage means having a first and second portion inversely synchronously conducting current, each of said pair of cascode stage means respectively receiving a first and a second portion of said signals, said first and second portions of said signals inversely synchronously changing respecting the other, said signals driving and dynamically biasing each of said cascode stage means,
   resistive network means for providing an average common mode signal, and
   feedback differential stage means for rejecting common mode signals on said pair of differential outputs, said feedback differential stage means receiving said average common mode signal and a bias reference, said feedback differential stage providing common mode rejection signals to said pair of cascode stage means serving to reject said common mode signals at said pair of differential outputs.

2. The full differential amplifier of claim 1 wherein said feedback current mirror means comprises,
   current path transistor means connected to one of said pair of coupled input transistor means for conducting said respective portion of said current,
   current mirror transistor means connected to said current path transistor means for conducting current equal to the current through said current path transistor means, and
   feedback transistor means for providing said signals, said feedback transistor means connected to said current mirror transistor means and conducting the current through said current mirror transistor means, said feedback transistor means providing a feedback signal to said current path transistor means.

3. The full differential amplifier of claim 1 wherein each of said cascode stage means comprises
   a first pair of transistor means both receiving a respective signal of said first portion of said signals, said first pair of transistor means connected in series and dynamically biased, and
   a second pair of transistor means both receiving a respective signal of said second portion of said signals, said second pair of transistor means connected in series and dynamically biased, said first and second portion of said signals synchronously changing respecting the other.

4. A full differential amplifier circuit receiving a pair of differential inputs and providing a pair of differential outputs,
   an input differential stage for receiving said differential inputs and for conducting a constant current, said input differential stage means having a pair of coupled transistor means respectively driving a pair of feedback current mirror means providing signals,
   a pair of mirror stage means for level shifting, converting and communicating said signals cross connected from said feedback current mirror means,
   a pair of cascode stage means each for receiving a respective inversely changing portion of said signals from said mirror stage means and each providing one of said pair of differential outputs inversely changing, each of said cascode stage means receiving a first and a second portion of said inversely changing portions of said signals, said first and second portions of said signals synchronously changing respecting the other portion of said signals, each of said first and second portions of said signals respectively driving and dynamically biasing a respective inversely conducting first and second portion of said cascode stage means,
   resistive network means for providing an average common mode signal from said pair of differential outputs, and
   a pair of feedback differential stage means for receiving said average common mode signal and a bias reference and for conducting said constant current, each of said feedback differential stage means having a pair of coupled transistor means respectively driving a pair of feedback current mirror means each respectively providing common mode rejection signals to respective ones of said pair of said cascode stage means serving to reject common mode signals from respective ones of said pair of differential outputs.

5. The full differential amplifier circuit of claim 4 further comprising a pair of compensation capacitor means respectively connected to each of said differential outputs for compensating said full differential amplifier.

6. The full differential amplifier circuit of claim 5 wherein each of said pair of compensation capacitor means comprises two capacitors connected in series between two power supply references with one of said differential outputs therebetween.

7. The full differential amplifier circuit of claim 4 further comprising a pair of follower stage means for buffering a respective one of said differential outputs and for providing a low output impedance.

8. The full differential amplifier circuit of claim 7 wherein each of said follower stage means comprises two transistors connected together in series between two power supply references, a first one of said two transistors driven by one of said differential outputs, a second one of said transistor driven by one of said signals.

9. The full differential amplifier of claim 4 wherein each of said feedback current mirror means comprises,
 current path transistor means connected to a respective one of said coupled transistor means for conducting a portion of said constant current,
 current mirror transistor means connected to said current path transistor means for conducting current equal to the current through said current path transistor means, and
 feedback transistor means for providing said signals, said feedback transistor means connected to said current mirror transistor means and conducting the current through said current mirror transistor means, said feedback transistor means providing a feedback signal to said current path transistor means.

10. The full differential amplifier circuit of claim 4 wherein each of said mirror current stage means shifts, converts and communicates each of said signals to a respective transistor means of said cascode stage means.

11. The full differential amplifier circuit of claim 4 wherein each of said cascode stage means comprises
 a first pair of transistor means for providing a first portion of an output signal at one of said pair of differential outputs, said first pair of transistors means connected in series between said one of said pair of differential outputs and a first power supply reference supplying current and power therethrough, said first pair of transistors means receiving said first portion of said signals changing in synchronism producing changing synchronized current through said first pair of transistor means, and
 a second pair of transistor means for providing a second portion of said output signal at said one of said pair of differential outputs, said second pair of transistors means connected in series between said one of said pair of differential outputs and a second power supply reference supplying current and power therethrough, said second pair of transistors means receiving said second portion of said signals changing in synchronism producing synchronized changing current through said second pair of transistor means, said first and second portions of said signals synchronously inversely changing respecting the other.

12. A method of producing differential output signals responsive to differential input signals comprising the steps of,
 determining the difference between the differential input signals,
 conducting respective portions of a constant current through a pair of feedback current mirror loads,
 shifting, converting and communicating signals from said feedback current mirror loads,
 inversely driving a pair dynamically biased cascode stages with said shifted, converted and communicated signals from said feedback current mirror loads, each of said cascode stages providing one of said differential output signals,
 averaging said differential output signals and providing an average common mode signal,
 determining the difference between a bias reference and said average common mode signal,
 providing common mode rejection current signals from at least one pair of other feedback current mirror loads, said signals responsive to said difference between said bias reference and said common mode signal, and
 synchronously driving said dynamically biased cascode stage towards said bias reference with said common mode rejection current signals whereby said common mode signals are eliminated from said differential outputs signals through negative feedback.

13. The method of producing differential output signals of claim 12, further comprising the step of compensating said differential output signals for stability through an operating frequency range.

14. The method of producing differential output signals of claim 12, further comprising the step of following said differential outputs for providing buffered differential output signals.

* * * * *